United States Patent
Chang

(10) Patent No.: US 7,576,403 B2
(45) Date of Patent: Aug. 18, 2009

(54) METHOD OF MANUFACTURING INFRARED RAYS RECEIVER AND STRUCTURE THEREOF

(75) Inventor: Wei Chang, San Chung (TW)

(73) Assignee: Unity Opto Technology Co., Ltd., Taipei Hsien (TW)

( * ) Notice: Subject to any disclaimer, the term of this patent is extended or adjusted under 35 U.S.C. 154(b) by 179 days.

(21) Appl. No.: 11/892,436

(22) Filed: Aug. 23, 2007

(65) Prior Publication Data
US 2008/0297665 A1    Dec. 4, 2008

(30) Foreign Application Priority Data
May 30, 2007    (TW) .............................. 96119287 A

(51) Int. Cl.
H01L 23/28    (2006.01)
H01L 21/56    (2006.01)

(52) U.S. Cl. ............... 257/434; 257/680; 257/E21.502; 438/64; 438/116; 438/124

(58) Field of Classification Search .................. 257/434
See application file for complete search history.

(56) References Cited

U.S. PATENT DOCUMENTS 4,293,768 A * 10/1981 Adachi et al. ............ 250/338.3
4,782,382 A * 11/1988 Godfrey ..................... 257/434
4,880,979 A * 11/1989 Yoshida ................... 250/338.4
5,763,900 A * 6/1998 Wang ........................... 257/81
7,009,267 B2 * 3/2006 Honboh ..................... 257/433
7,157,709 B2 * 1/2007 Taniguchi et al. ........ 250/338.3

* cited by examiner

Primary Examiner—Stephen W Smoot
(74) Attorney, Agent, or Firm—Rosenberg, Klein & Lee

(57) ABSTRACT

A method of manufacturing an infrared rays receiver comprises the steps of: chip attach; wire bonding; encapsulation; metal housing covering; encapsulation; pin cutting; and testing. A lead frame has several pins, wherein one pin has a coupling part. An infrared rays receiving chip is coupled to the coupling part of the pin of the lead frame, and electrically connected to the other pins by bonding wires. Thereafter, a light-pervious adhesive encapsulates part of the lead frame, the chip, and the bonding wires. Thereafter, the light-pervious adhesive is covered with a metal housing having a through hole so as to expose the infrared rays receiving chip via the through hole. Thereafter, the metal housing and the light-pervious adhesive are encapsulated into a unity by a colored adhesive. Consequently, the infrared rays receiver is protected from the occurrence of short circuits and has a metal shielding effect to provide a longer transmission distance.

8 Claims, 3 Drawing Sheets

METHOD OF MANUFACTURING INFRARED RAYS RECEIVER AND STRUCTURE THEREOF

FIELD OF THE INVENTION

The present invention relates to a method of manufacturing an infrared rays receiver and a structure thereof, which is protected from the occurrence of short circuits and has a metal shielding effect to realize a longer transmission distance.

BACKGROUND OF THE INVENTION

A conventional infrared rays receiver generally has an iron housing that covers a diode. Instead of covering the diode with the iron housing, the conventional infrared rays receiver alternatively has a black adhesive that covers the diode. However, short circuits may occur during the practical use of the infrared rays receiver that has the iron housing. Although the infrared rays receiver that has no iron housing is free from the occurrence of short circuits, it has a shorter transmission distance due to the absence of metal shielding.

In view of this, the present inventor makes diligent studies in providing general public with a method of manufacturing an infrared rays receiver and a structure thereof, which is protected from the occurrence of short circuits and has a metal shielding effect to provide a longer transmission distance.

SUMMARY OF THE INVENTION

It is an object of the present invention to provide a method of manufacturing an infrared rays receiver and a structure thereof, which is protected from the occurrence of short circuits and has a metal shielding effect to provide a longer transmission distance.

In order to achieve the foregoing object, a method of manufacturing an infrared rays receiver comprises the steps of: chip attach; wire-bonding; encapsulation; metal housing covering; encapsulation; pin cutting; and testing. A lead frame has a plurality of pins, wherein one pin has a coupling part. An infrared rays receiving chip is coupled to the coupling part of the pin of the lead frame, and electrically connected to the other pins by bonding wires. Thereafter, a light-pervious adhesive encapsulates part of the lead frame, the chip, and the bonding wires. Thereafter, the light-pervious adhesive is covered with a metal housing having a through hole so as to expose the infrared rays receiving chip via the through hole. Thereafter, the metal housing and the light-pervious adhesive are encapsulated into a unity by a colored adhesive. Consequently, the infrared rays receiver is protected from the occurrence of short circuits and has a metal shielding effect to provide a longer transmission distance.

The aforementioned and other objects and advantages of the present invention will be readily clarified in the description of the preferred embodiments and the enclosed drawings of the present invention.

DETAILED DESCRIPTION OF THE PREFERRED EMBODIMENT

Figure 1:
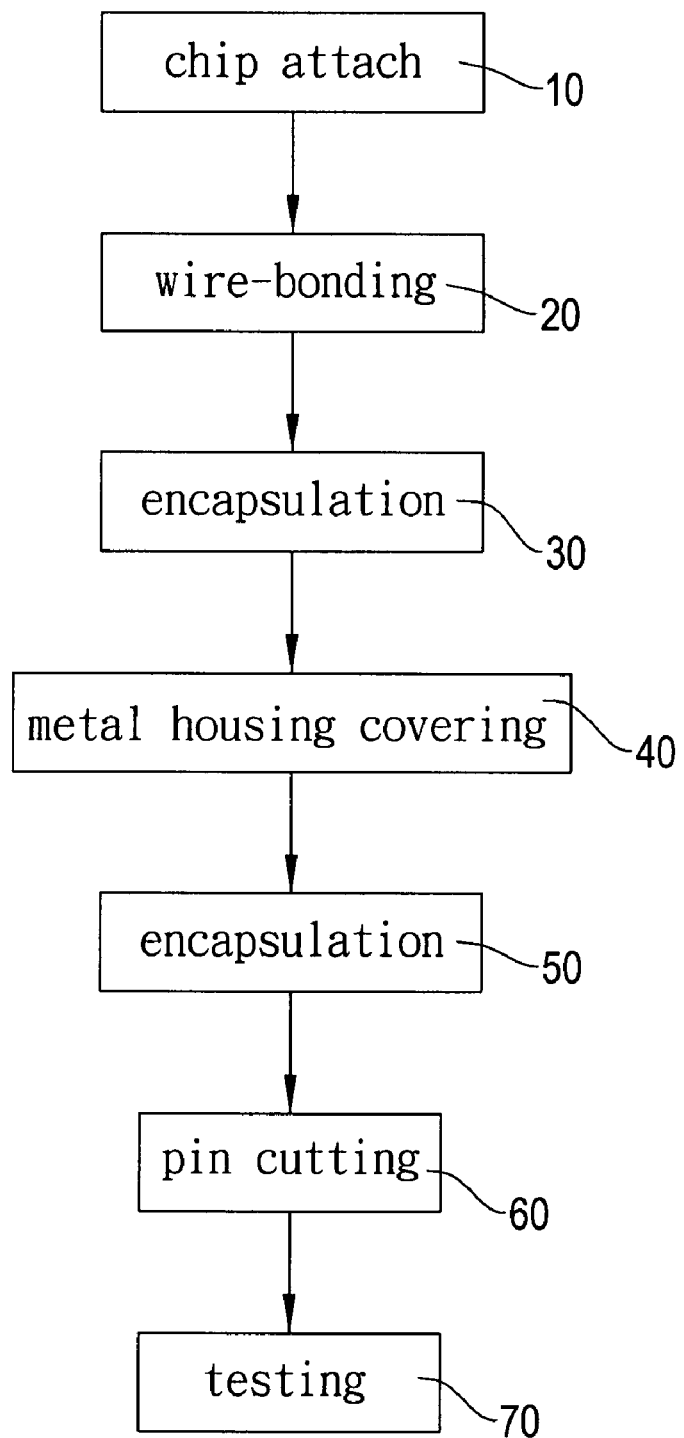
FIG. 1 is a flow diagram showing the manufacture process of the present invention.

Referring to FIG. 1, a manufacture process of the present invention comprises the steps of:

(a) chip attach 10: attaching an infrared rays receiving chip to one pin of a lead frame;

(b) wire-bonding 20: connecting the infrared rays receiving chip with the other pins of the lead frame by several bonding wires;

(c) encapsulation 30: encapsulating part of the lead frame, the infrared rays receiving chip and the bonding wires into a unity by a light-pervious adhesive;

(d) metal housing covering 40: covering the light-pervious adhesive with a metal housing having a through hole on one side;

(e) encapsulation 50: encapsulating the metal housing with a colored adhesive;

(f) pin cutting 60: cutting off connection sections of the lead frame; and (g) testing 70: performing a testing on the above obtained infrared rays receiver.

Figure 2:
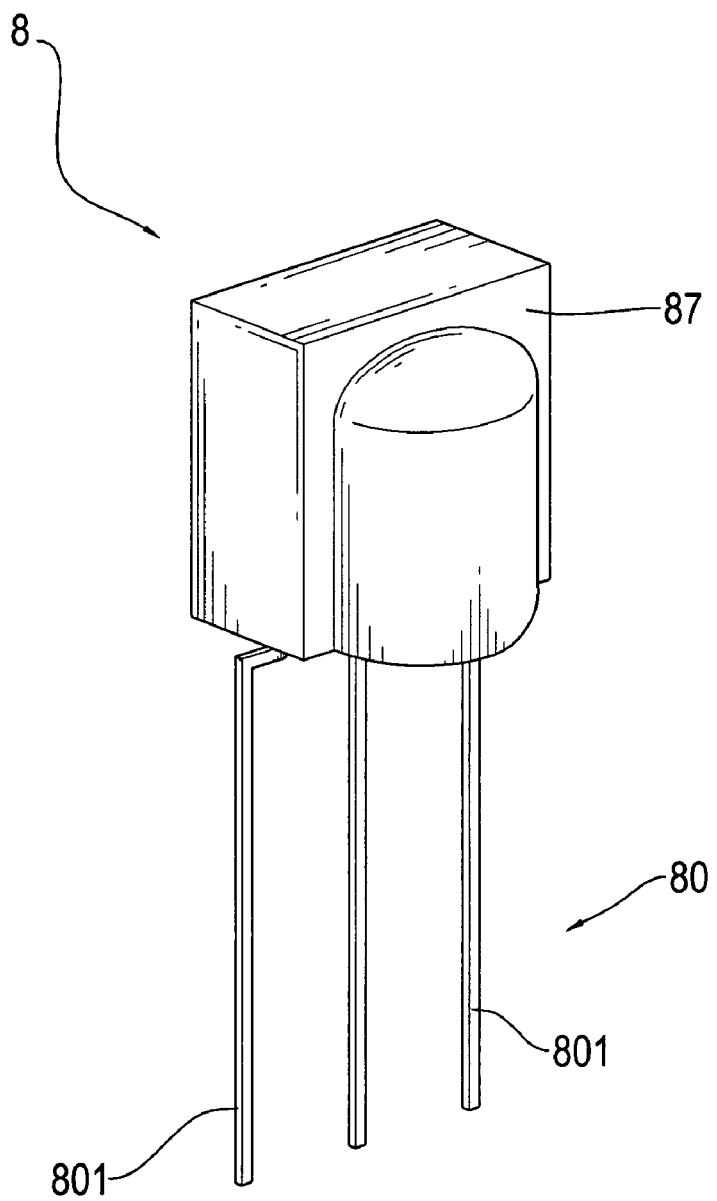
FIG. 2 is an elevational view of the present invention.
Figure 3:
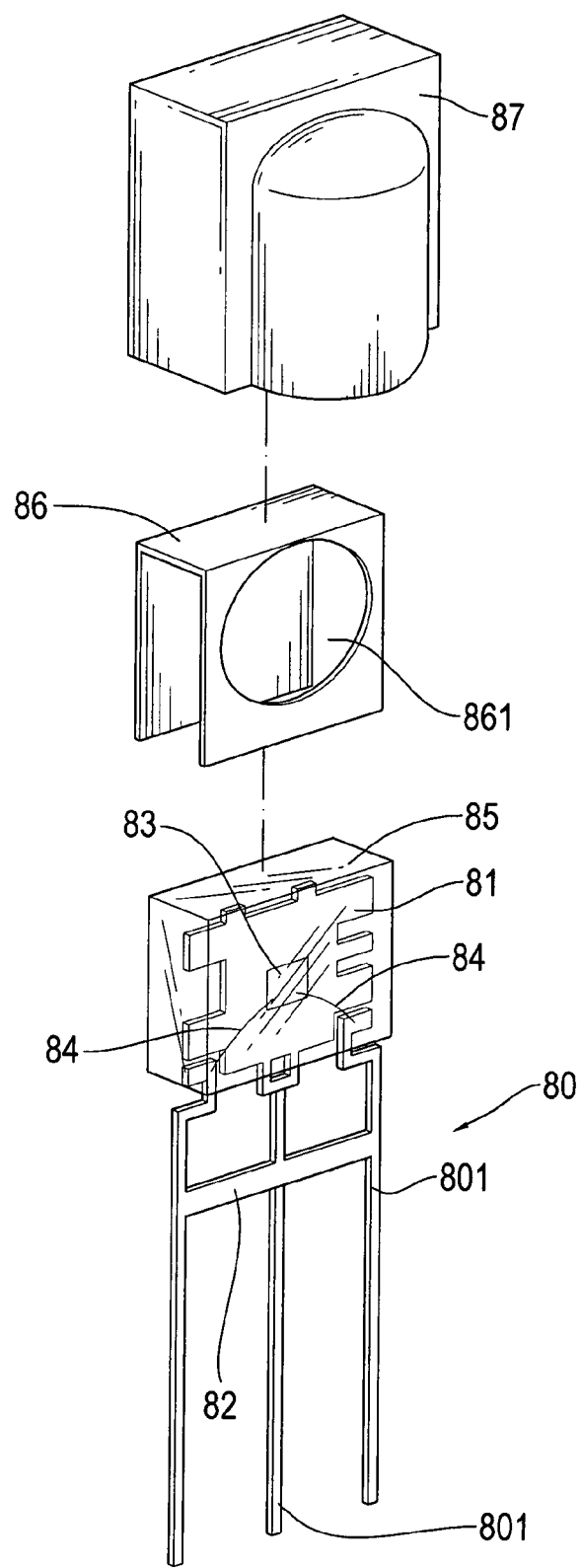
FIG. 3 is a schematic, partial decomposed view of the present invention.

In the practical manufacture of the infrared rays receiver, as shown in FIGS. 2 and 3, the lead frame 80 is composed of several pins 801. There are three pins 801 in this preferred embodiment, wherein one pin 801 has a large-area coupling part 81 on the top. There are three pins 801 are connected with one another by connection sections 82. Thereafter, an infrared rays receiving chip 83 is coupled with the coupling part 81, and connected with the other two pins 801 by two bonding wires 84. Thereafter, partial upper portion of the lead frame including the infrared rays receiving chip 83 and these two bonding wires 84 are encapsulated into a unity by a light-pervious adhesive 85. Thereafter, the light-pervious adhesive 85 is covered with a metal housing 86 that has a through hole 861 formed thereon so that the infrared rays receiving chip 83 is exposed to the outside via the through hole 861 and not sheltered by the metal housing 86. Thereafter, the metal housing 86 is covered with a colored light-pervious resin. In this preferred embodiment, the metal housing 86 is entirely covered with a block resin 87. Finally, the connection sections 82 that connect the pins 801 of the lead frame 80 with one another are cut off to complete the structure of the infrared rays receiver 8.

In the above-mentioned infrared rays receiver 8, the metal housing 86 is mounted on the inside of the block resin 87 and the through hole 861 is formed on the metal housing 86 so that the infrared rays receiving chip 83 is not sheltered by the metal housing 86 and can be exposed to the outside via the through hole 861. In addition, the metal housing 86 is further covered with the block resin 87 to prevent exposure of the metal housing 86. Consequently, the infrared rays receiver 8 is protected from the occurrence of short circuits and has a metal shielding effect to provide a longer transmission distance.

To sum up, the present invention is capable of achieving the aforementioned objects. The present invention discloses a method of manufacturing an improved infrared rays receiver and a structure thereof to improve the drawbacks of the conventional infrared rays receiver that has an iron housing mounted on the outside, causing short circuits easily, or that has no iron housing, causing a shorter transmission distance. The infrared rays receiver of the present invention has a simplified manufacture process and a reduced thickness. Therefore, this application is filed according to the patent law.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What the invention claimed is:

1. A method of manufacturing an infrared rays receiver, comprising the steps of:
    (a) chip attach: attaching an infrared rays receiving chip to one pin of a lead frame;
    (b) wire-bonding: connecting said infrared rays receiving chip with the other pins of said lead frame by a plurality of bonding wires;
    (c) encapsulation: encapsulating part of said lead frame, said infrared rays receiving chip and said bonding wires into a unity by a light-pervious adhesive;
    (d) metal housing covering: covering said light-pervious adhesive with a metal housing having a through hole on one side;
    (e) encapsulation: encapsulating said metal housing with a colored adhesive;
    (f) pin cutting: cutting off a plurality of connection sections of said lead frame; and
    (g) testing: performing a testing on said infrared rays receiver obtained above.

2. A method of manufacturing an infrared rays receiver according to claim 1, wherein said light-pervious adhesive is a transparent resin.

3. A method of manufacturing an infrared rays receiver according to claim 1, wherein said colored adhesive is a black resin.

4. A method of manufacturing an infrared rays receiver according to claim 1, wherein said metal housing is an iron housing.

5. An infrared rays receiver, comprising:
    a lead frame having a plurality of pins having a coupling part on one pin of said pins;
    an infrared rays receiving chip coupled to said coupling part of said one pin of said pins and electrically connected with the rest of said pins by a plurality of bonding wires;
    a light-pervious adhesive for encapsulating part of said lead frame, said infrared rays receiving chip and said bonding wires;
    a metal housing having a through hole on one side for covering said light-pervious adhesive to expose said infrared rays receiving chip via said through hole; and
    a colored adhesive for encapsulating said metal housing and said light-pervious adhesive into a unity.

6. An infrared rays receiver according to claim 5, wherein said light-pervious adhesive is a transparent resin.

7. An infrared rays receiver according to claim 5, wherein said colored adhesive is a black resin.

8. An infrared rays receiver according to claim 5, wherein said metal housing is an iron housing.

* * * * *